United States Patent
Lima

(10) Patent No.: US 8,318,546 B2
(45) Date of Patent: Nov. 27, 2012

(54) THERMAL MANAGEMENT OF ELECTRONIC DEVICES

(75) Inventor: David J. Lima, Los Altos, CA (US)

(73) Assignee: Juniper Networks, Inc., Sunnyvale, CA (US)

(*) Notice: Subject to any disclaimer, the term of this patent is extended or adjusted under 35 U.S.C. 154(b) by 0 days.

(21) Appl. No.: 13/090,375

(22) Filed: Apr. 20, 2011

(65) Prior Publication Data

US 2011/0192587 A1 Aug. 11, 2011

Related U.S. Application Data

(60) Continuation of application No. 12/605,035, filed on Oct. 23, 2009, now Pat. No. 7,951,650, which is a division of application No. 11/363,095, filed on Feb. 28, 2006, now Pat. No. 7,629,683.

(51) Int. Cl.
*H01L 21/44* (2006.01)
*H01L 21/48* (2006.01)

(52) U.S. Cl. .. 438/122; 438/107; 438/629; 257/E23.101

(58) Field of Classification Search ............... 438/122, 438/107, 629; 257/E23.101
See application file for complete search history.

(56) References Cited

U.S. PATENT DOCUMENTS

| | | | |
|---|---|---|---|
| 4,535,385 A | 8/1985 | August et al. | |
| 4,739,448 A | 4/1988 | Rowe et al. | |
| 5,027,191 A | 6/1991 | Bourdelaise et al. | |
| 5,475,264 A | 12/1995 | Sudo et al. | |
| 5,719,750 A | 2/1998 | Iwane | |
| 5,792,677 A | 8/1998 | Reddy et al. | |
| 5,923,084 A * | 7/1999 | Inoue et al. | 257/712 |
| 6,069,793 A | 5/2000 | Maruyama et al. | |
| 6,201,300 B1 * | 3/2001 | Tseng et al. | 257/706 |
| 6,377,464 B1 | 4/2002 | Hashemi et al. | |
| 6,592,269 B1 * | 7/2003 | Brophy et al. | 385/92 |
| 6,671,176 B1 | 12/2003 | Barcley | |
| 6,683,512 B2 * | 1/2004 | Nakamata et al. | 333/126 |
| 6,770,967 B2 | 8/2004 | Barcley | |
| 6,794,747 B2 | 9/2004 | Takehara et al. | |

(Continued)

FOREIGN PATENT DOCUMENTS

EP 0 600 590 A1 6/1994

(Continued)

OTHER PUBLICATIONS

European communication corresponding to European Application No. EP 07 250 789.0, mailed Oct. 15, 2010, 6 pages.

(Continued)

*Primary Examiner* — Nitin Parekh
(74) *Attorney, Agent, or Firm* — Harrity & Harrity, LLP

(57) ABSTRACT

Thermal management is provided for a device. The device may include a substrate having a mounting area on a first surface of the substrate. The device may also include first thermal vias extending from the mounting area to at least an interior of the substrate. The device may also include at least one thermal plane substantially parallel to the first surface of the substrate, the at least one thermal plane being in thermal contact with at least one of the first thermal vias. The device may also include a heat sink attachment area, and second thermal vias extending from the heat sink attachment area to the interior of the substrate, the at least one thermal plane being in thermal contact with the second thermal vias.

15 Claims, 8 Drawing Sheets

U.S. PATENT DOCUMENTS

| | | |
|---|---|---|
| 7,045,440 B2 * | 5/2006 | Huff et al. ............... 438/456 |
| 7,148,554 B2 * | 12/2006 | Nah et al. ............... 257/532 |
| 7,190,056 B2 | 3/2007 | Nurminen |
| 7,405,474 B1 | 7/2008 | Brophy |
| 7,629,683 B1 | 12/2009 | Lima |
| 2003/0020173 A1 | 1/2003 | Huff et al. |
| 2005/0133929 A1 | 6/2005 | Howard |
| 2005/0254215 A1 | 11/2005 | Khbeis et al. |
| 2010/0039775 A1 | 2/2010 | Lima |

FOREIGN PATENT DOCUMENTS

| | | |
|---|---|---|
| EP | 0 871 352 A1 | 10/1998 |
| WO | WO 94/23556 | 10/1994 |

OTHER PUBLICATIONS

European Search Report corresponding to European Application No. EP 07 25 0789, dated Apr. 17, 2009, 6 pages.

* cited by examiner

THERMAL MANAGEMENT OF ELECTRONIC DEVICES

RELATED APPLICATIONS

This application is a continuation of U.S. patent application Ser. No. 12/605,035, filed Oct. 23, 2009, which is a divisional of U.S. patent application Ser. No. 11/363,095, filed Feb. 28, 2006 (now U.S. Pat. No. 7,629,683), which are incorporated herein by reference.

FIELD OF THE INVENTION

Implementations consistent with the principles of the invention relate generally to heat dissipation and, more particularly, to systems and methods of heat transfer through a substrate supporting electronic components to control operating temperatures of the electronic components.

BACKGROUND OF THE INVENTION

Physical compactness of electronic devices, such as interface devices mounted at a user interface edge of an electronic assembly, impedes cooling of the electronic devices, which is a particular concern for electronic devices that consume a substantial amount of power, and thus generate a significant amount of heat. For example, when transceivers, such as small form-factor pluggable (SFP) modules, are ganged into multiple cages, the transceivers in the middle of the cluster may generate and retain an undesirable amount of heat. Very little airflow may reach individual modules in certain positions of the cluster for cooling purposes. Unlike stand-alone devices, which have relatively large surface areas that may radiate heat, clustered devices may have only limited surface area from which to radiate heat.

SUMMARY OF THE INVENTION

According to one aspect, a device may include a substrate that may include a first mounting area on a first surface of the substrate. The device may also include a group of first thermal vias extending from the first mounting area to at least an interior of the substrate. The device may also include at least one thermal plane substantially parallel to the first surface of the substrate, the at least one thermal plane being in thermal contact with at least one of the first thermal vias. The device may also include a heat sink attachment area. In addition, the device may include a group of second thermal vias extending from the heat sink attachment area to the interior of the substrate, the at least one thermal plane being in thermal contact with the second thermal vias.

According to another aspect, a method of heat transfer in a substrate may include conducting heat from a component to a component mount mounted on a first mounting surface of the substrate. The method may also include conducting the heat from the component mount to a first set of thermal vias that extend from the first mounting surface to at least an interior of the substrate. The method may also include conducting the heat from the first set of thermal vias to one or more thermal planes disposed along a length of the substrate. The method may also include conducting the heat from the one or more thermal planes to a second set of thermal vias. The method may also include conducting the heat from the second set of thermal vias to a heat sink attachment surface of the substrate. In addition, the method may include conducting the heat from the heat sink attachment surface of the substrate to a heat sink mounted to a heat sink attachment surface of the substrate.

According to yet another aspect, a method of forming a substrate may include disposing one or more thermal planes in the substrate. The method may also include providing a first set of thermal vias in a component mounting area on a first side of the substrate, the first set of the thermal vias being thermally coupled to the component mounting area and to the one or more thermal planes. In addition, the method may include providing a second set of thermal vias extending from a heat sink attachment area on the first side of the substrate, the second set of the thermal vias being thermally coupled to the one or more planes and to the heat sink attachment area.

BRIEF DESCRIPTION OF THE DRAWINGS

The accompanying drawings, which are incorporated in and constitute a part of this specification, illustrate an implementation of the invention and, together with the description, explain the invention. In the drawings.

DETAILED DESCRIPTION

The following detailed description of embodiments of the principles of the invention refers to the accompanying drawings. The same reference numbers in different drawings may identify the same or similar elements. Also, the following detailed description does not limit the invention. Instead, the scope of the invention is defined by the appended claims and equivalents.

Systems and methods consistent with the principles of the invention may provide controlled cooling of a component, such as an input/output device, that may be located in a compact configuration at a user interface edge of an interface card, by conducting heat away from the component using a system of thermally coupled thermal vias and thermal planes on and/or in a substrate to a heat sink that may be disposed in an available airflow that may flow by the interface card.

Exemplary Device Configuration

Figure 1:
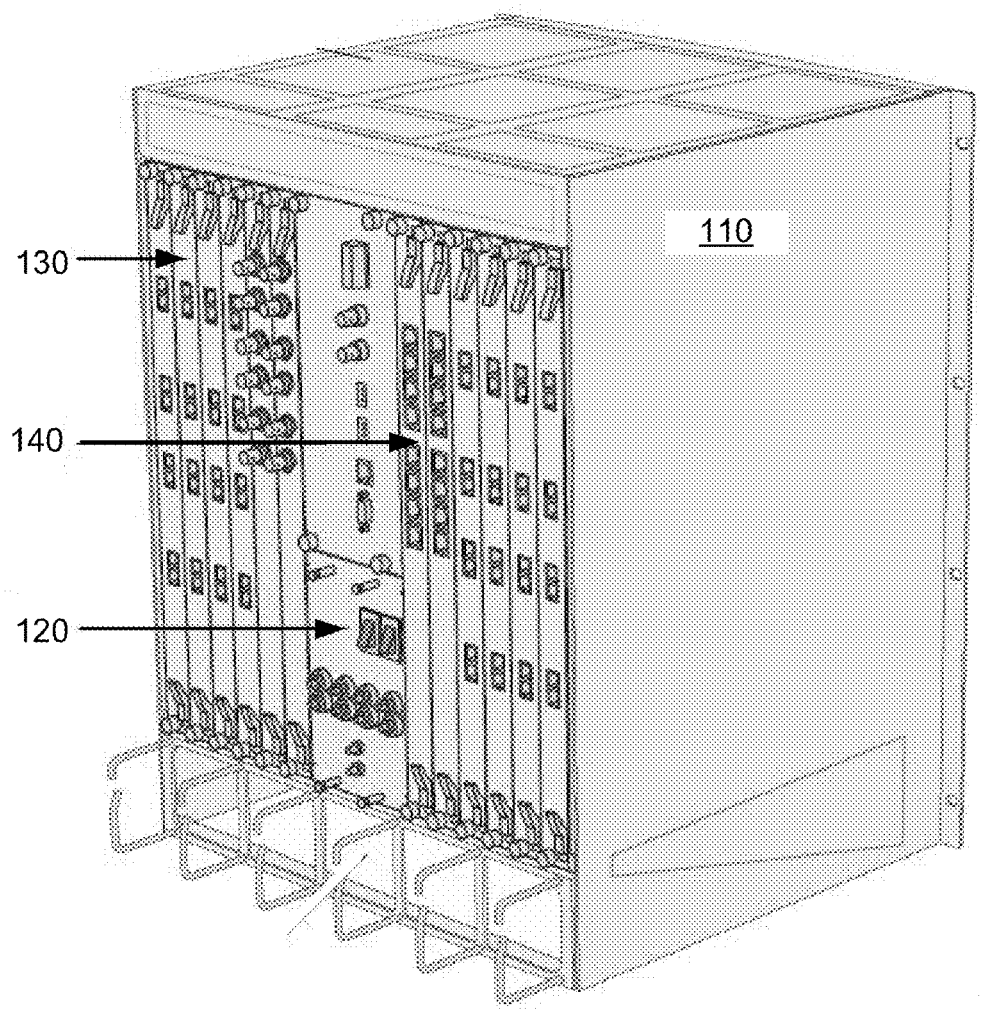
FIG. 1 is a diagram illustrating an exemplary device in which methods and systems consistent with the principles of the invention can be implemented.

FIG. 1 illustrates an exemplary device 100 in which systems and methods consistent with the principles of the invention may be implemented. As illustrated, device 100 may include a housing 110 that houses various modules 120 (e.g., controller, power supply, etc.) and card slots 130 which operably receive interface cards 140.

In one implementation, device 100 may include any device that receives, processes, and/or transmits data, such as a server, a router, or a switch.

In one implementation, housing 110 may include any structure configurable to retain and/or support a chassis, removable cards, and/or other modules that may be used in operation of device 100. The number and type of cards, modules, and other system components illustrated in FIG. 1 are provided for simplicity. In practice, a typical device could include more or fewer cards, modules, and other removable or fixed components that aid in receiving, processing, and/or transmitting data, than what is illustrated in FIG. 1. Housing 110 may be fabricated from metal, plastic, and/or composite and may be sized for particular applications. In one implementation, housing 110 may be sized to fit an industry standard mounting structure, such as an equipment rack.

Figure 2:
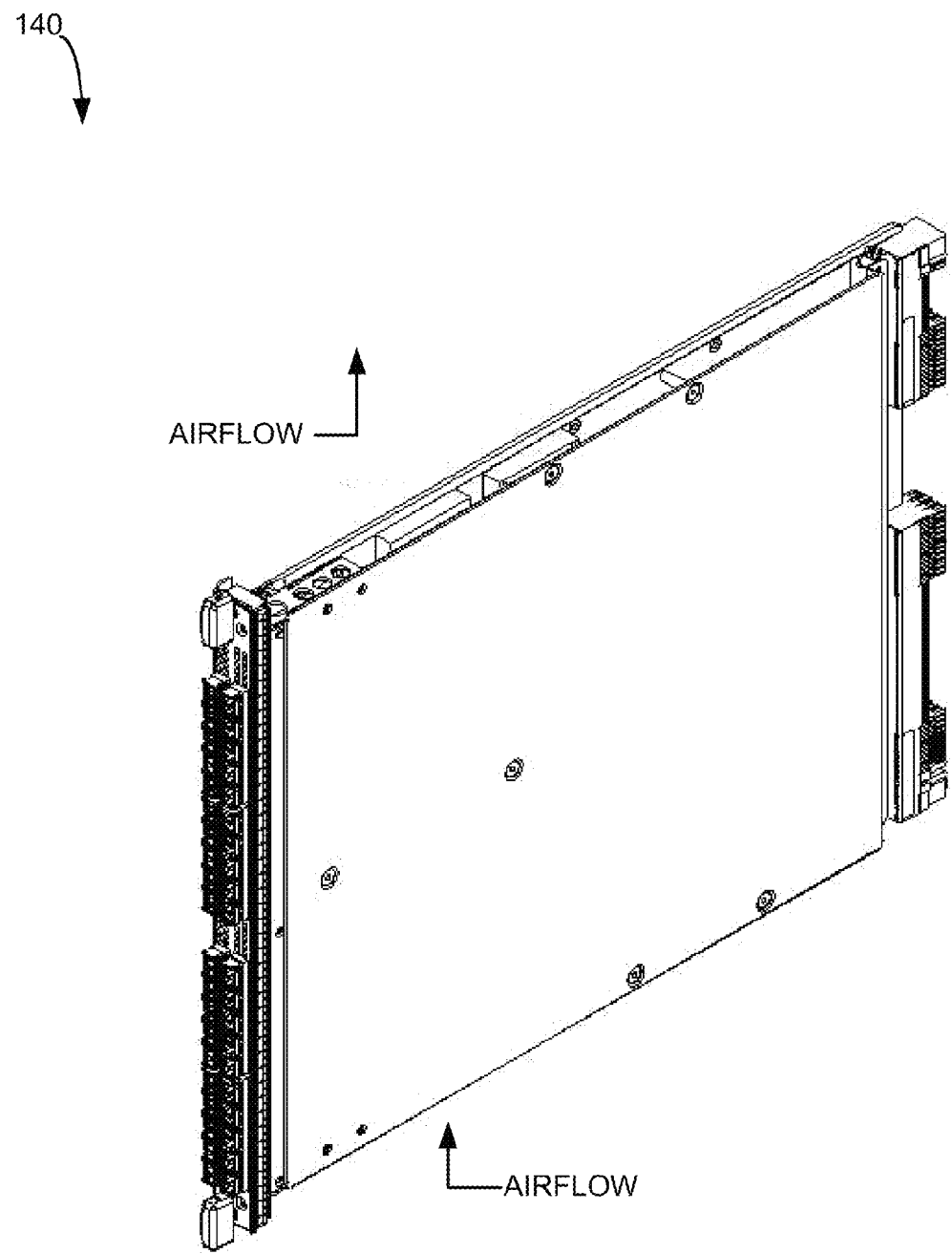
FIG. 2 is an exemplary diagram of the interface card of FIG. 1 according to an implementation consistent with the principles of the invention.

FIG. 2 illustrates exemplary interface card 140 in an orientation representative of being configured in card slot 130 in housing 110 (FIG. 1), for which airflow may be represented by the directional arrows shown. It should be appreciated that the cooling effect produced by the airflow may not be uniform over the various surfaces of interface card 140.

Figure 3:
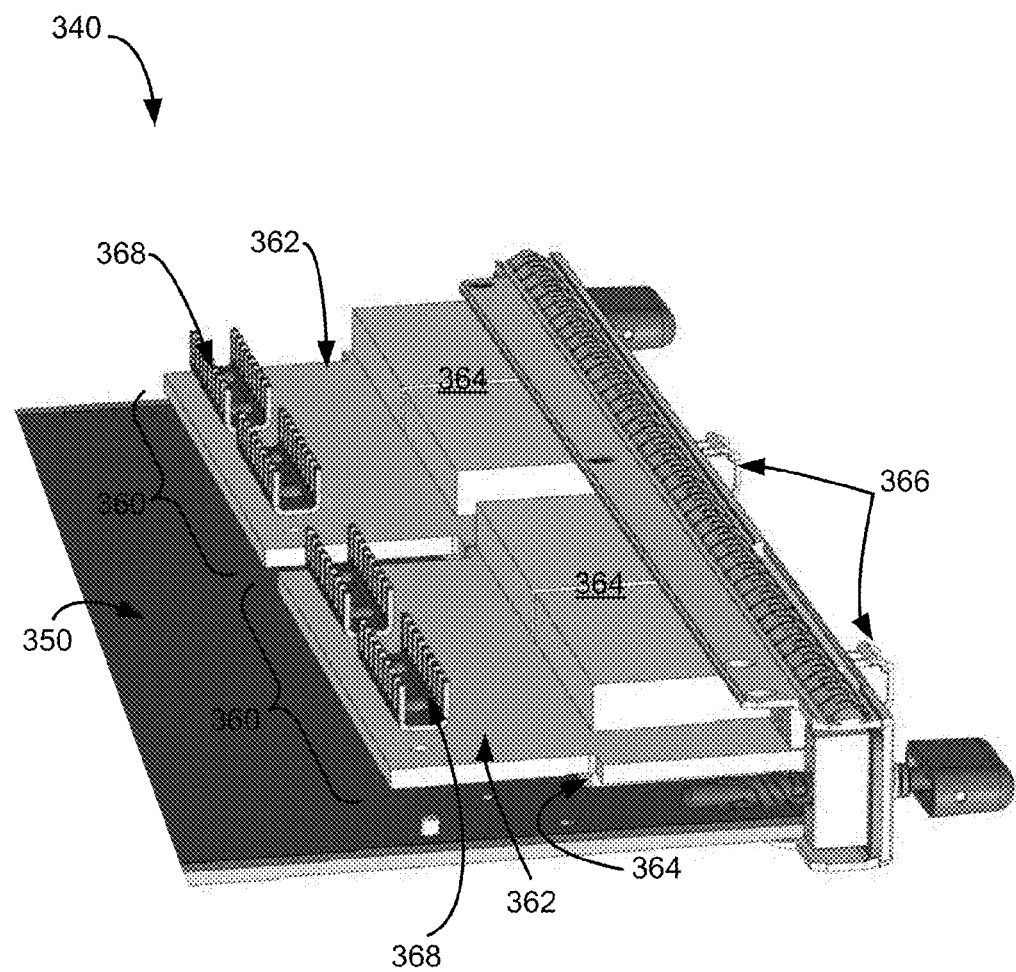
FIG. 3 is a cut-away view of an exemplary interface card in which methods and systems consistent with the principles of the invention can be implemented.

FIG. 3 illustrates an internal view of one end of an exemplary interface card 340. Interface card 340 may include a motherboard 350 and an interface unit 360. Motherboard 350 may include any substrate, such as a circuit board, e.g., a printed circuit board (PCB). Interface card 340 may include more than one interface unit 360.

Interface unit 360 may include a daughterboard 362, interface module cages 364 for receiving interface modules 366, and heat sinks 368. In one implementation, interface modules 366 may attach directly to daughterboard 362 and interface module cages 364 are omitted. Interface unit 360 may include any input/output device, such as a small form-factor pluggable (SFP) interface, an XFP (10 Gigabit SFP), or any type of transceiver. Interface unit 360 may electrically, structurally, and/or thermally connect to motherboard 350. Interface unit 360 may be located at a user-accessible end of motherboard 350. Other configurations are possible.

Daughterboard 362 may include any substrate, such as a PCB. Daughterboard 362 may have any dimensions corresponding to the dimensions of interface card 340. In one implementation, motherboard 350 may include interface unit 360. That is, motherboard 350 and interface unit 360 may be an integral PCB, without a separate daughterboard 362.

Interface module cages 364 may include any device for receiving and retaining interface modules 366. Interface module cages 364 may include ganged individual module cages. Other configurations of interface module cages 364 are possible. As shown, interface module cages 364 may be arranged on opposing sides of daughterboard 362. Interface modules 366 may include any electronic component and/or circuitry, such as an SFP module, e.g., an SFP optical modular transceiver. In one implementation, interface modules 366 are hot-swappable.

Heat sinks 368 may include any device that may absorb, conduct, radiate, and/or dissipate heat. Heat sinks 368 may include any material having any thermal conductivity. Heat sinks 368 may have any shape or dimensions. Any number of heat sinks 368 may be used. Thermal conductivity properties of any one heat sink 368 may vary from another heat sink 368. As shown, heat sinks 368 may be disposed at a remote end of daughterboard 362. Other configurations of the heat sinks 368 are possible. For example, heat sinks 368 may be disposed on two or more surfaces on daughterboard 362. In one implementation, the location of heat sinks 368 is based on an airflow in device 100.

Figure 4A:
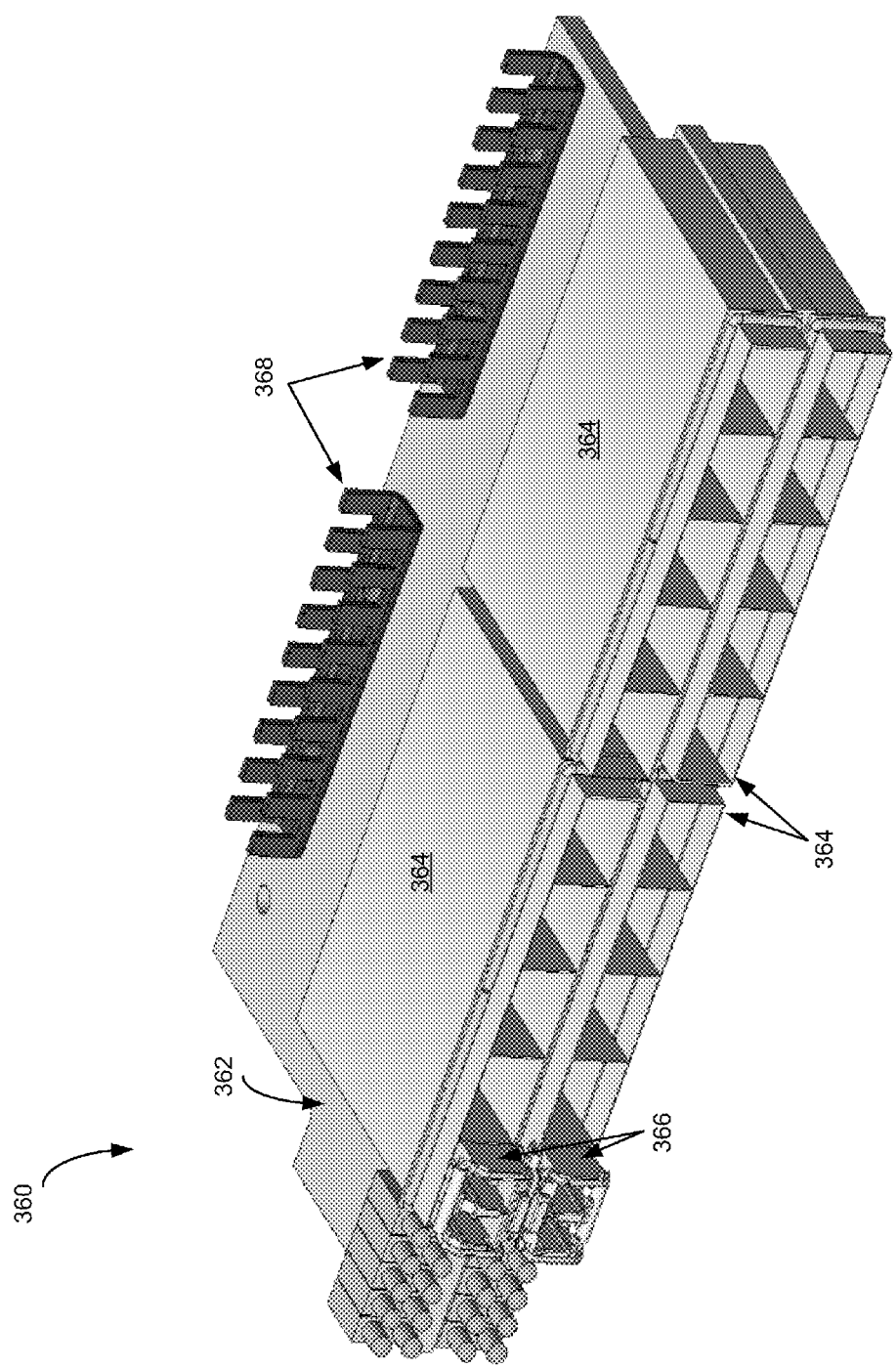
FIGS. 4A, 4B, and 4C illustrate an exemplary interface unit in which methods and systems consistent with the principles of the invention can be implemented.
Figure 4B:
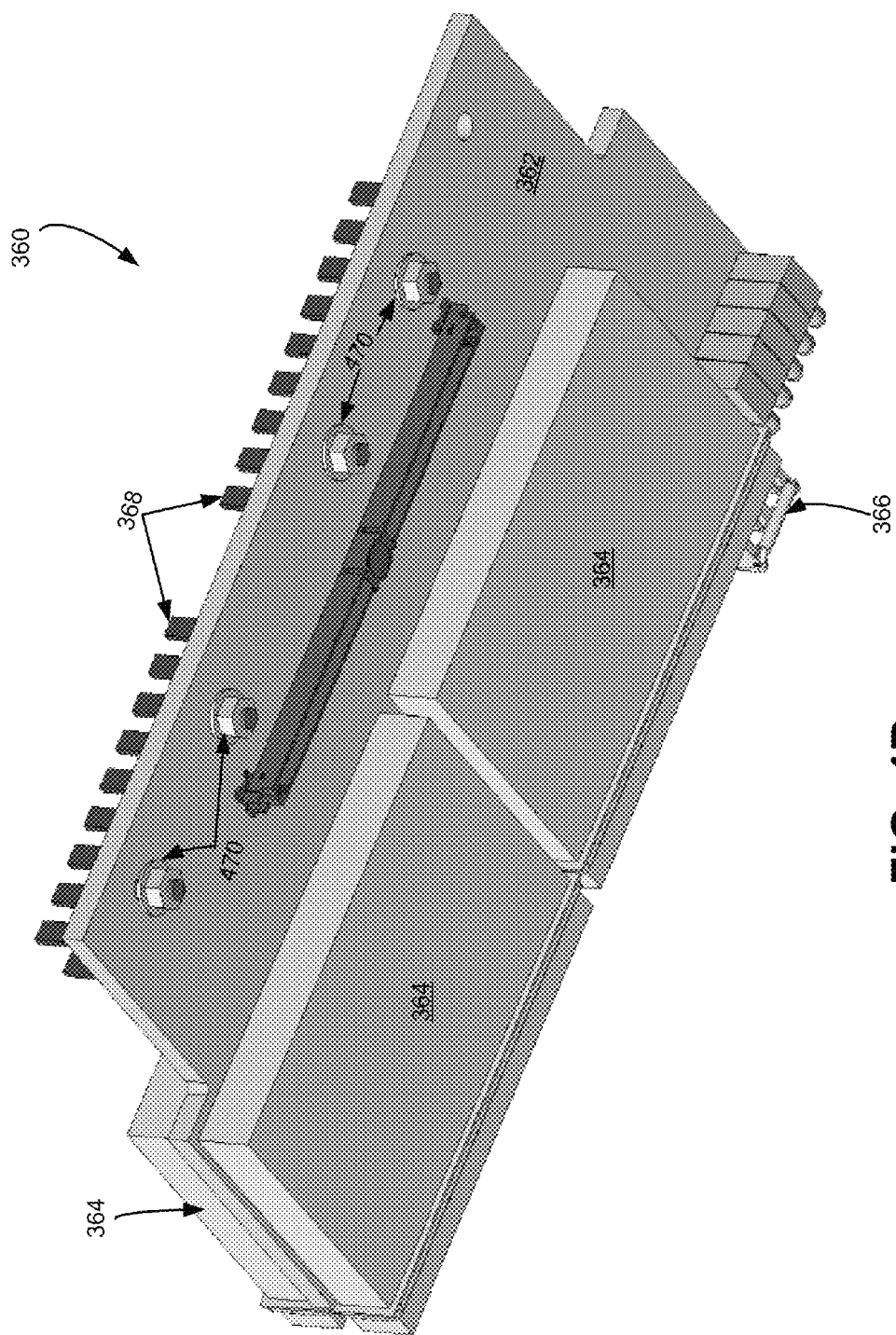

FIGS. 4A and 4B illustrate opposing views of an exemplary interface unit 360. As shown, interface unit 360 may include four interface module cages 364, two side-by-side mounted at a mounting area of a first surface of daughterboard 362, and two side-by-side mounted at a mounting area of an opposite second surface of daughterboard 362 along an accessible edge of interface unit 360. Other configurations may be used. Any mechanism may be used to mount interface module cages 364 to daughterboard 362. In one implementation, a thermal interface material (not shown) is interposed between a mounting surface of interface module cages 364 and the mounting area on the surface of daughterboard 362. As shown, two interface modules 366 are respectively plugged into two interface module cages 364. Interface unit 360 may include heat sinks 368 attached to daughterboard 362 at an attachment area by attachment members 470 (FIG. 4B). Other attachment mechanisms may be used. In one implementation, a thermal interface material (not shown) is interposed between a mounting surface of heat sinks 368 and the attachment area on the surface of daughterboard 362.

Figure 4C:
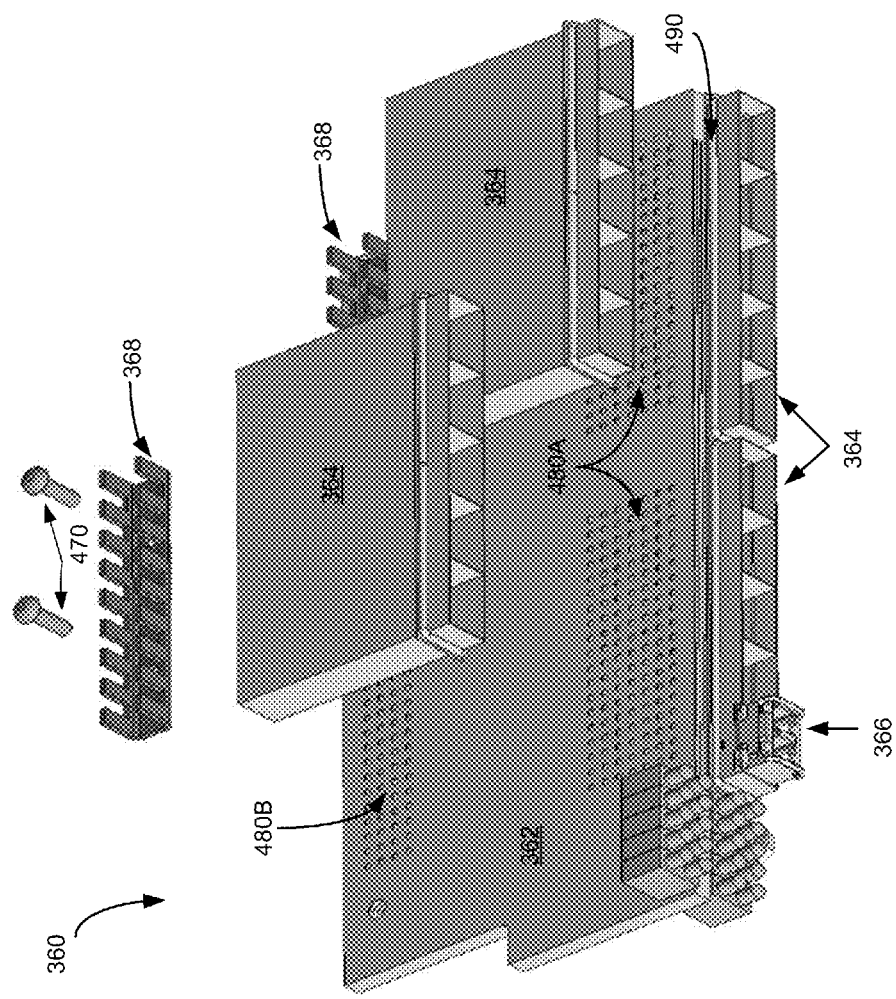

FIG. 4C illustrates an exploded view of interface unit 360. Daughterboard 362 may include thermal vias 480A that terminate on a surface of daughterboard 362 in an area of interface module cages 364 and terminate on an opposing surface of daughterboard 362. Daughterboard 362 may include thermal vias 480B that terminate on a surface of daughterboard 362 in an area of heat sinks 368 and extend to an interior of daughterboard 362. Daughterboard 362 may include thermal planes 490. Thermal planes 490 may be exposed at the edge of daughterboard 362. Thermal planes 490 may alternatively not be exposed at the edge of daughterboard 362. Thermal planes 490 may be electrically insulated from electrical connections, electrical vias, or electrical planes. Thermal planes may alternately include power planes, ground planes, and the like.

Figure 5:
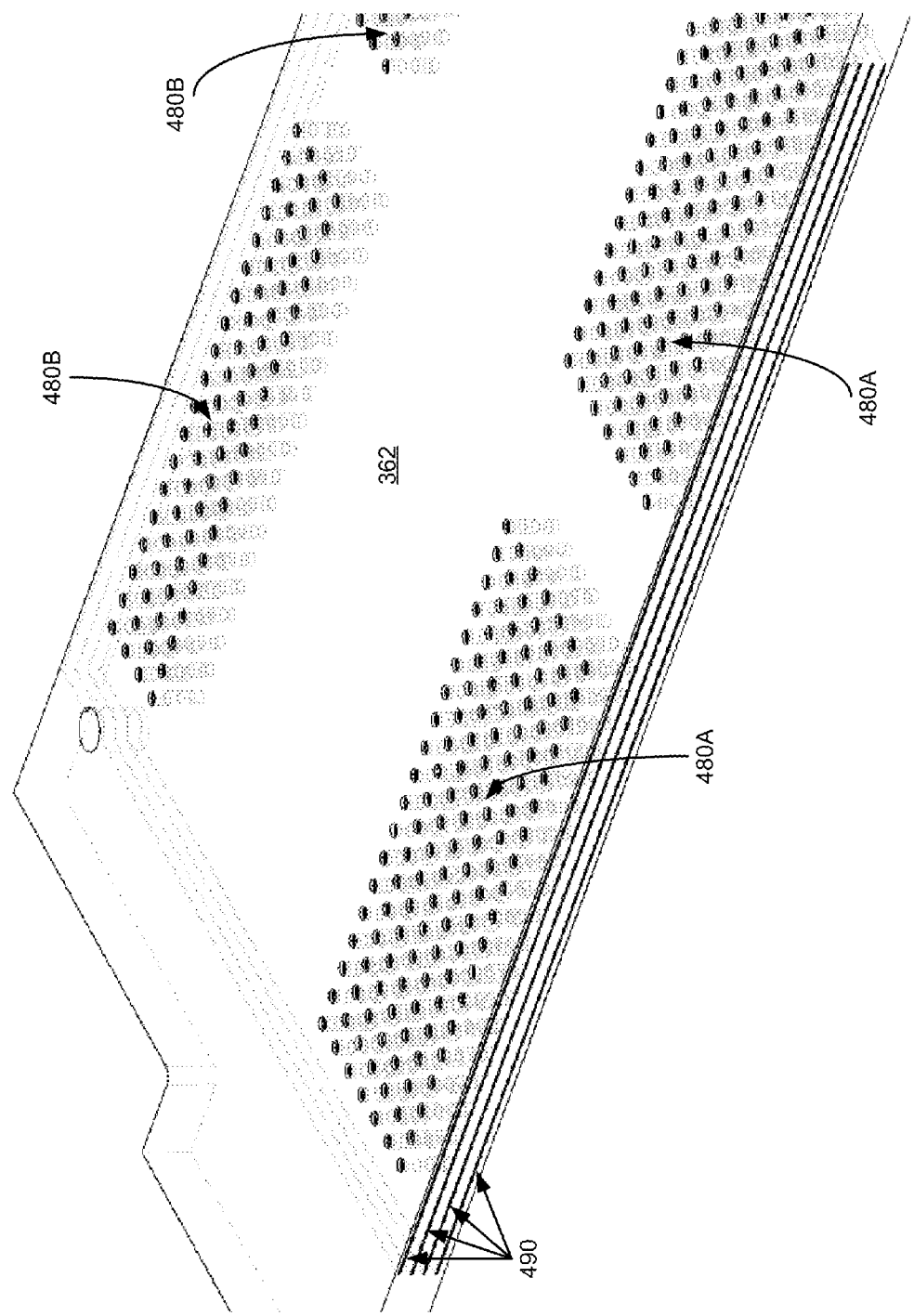
FIG. 5 is a line image of the exemplary daughterboard of FIGS. 4A-4C.

FIG. 5 illustrates a partial line image of daughterboard 362, showing an internal construction thereof. Thermal vias 480A and 480B may include one or more through-holes that extend from a surface of daughterboard 362 to an interior of daughterboard 362. In one implementation, thermal vias 480A and 480B may extend from one surface of daughterboard 362 to an opposing surface of daughterboard 362. Thermal planes 490 may include one or more thermal conducting layers separated by substrate layers of daughterboard 362. Thermal planes 490 may be configured substantially parallel to daughterboard 362. Thermal planes 490 may extend from thermal vias 480A to thermal vias 480B. Thermal planes 490 may be exposed at an edge of daughterboard 362. Any of thermal vias 480A may thermally couple to any or each of thermal planes 490, and any of thermal planes 490 may thermally couple to any or each of thermal vias 480B.

Thermal vias 480A and 480B may form a uniform pattern on the surface of daughterboard 362. Thermal vias 480A and 480B may alternatively be non-uniformly arranged on the surface of daughterboard 362. Thermal vias 480A and 480B may extend substantially perpendicularly from the surface to an interior of daughterboard 362. Thermal vias 480A and 480B may alternatively extend at any angle from the surface to an interior of daughterboard 362. Thermal vias 480A and 480B may have a substantially circular cross-section. Thermal vias 480A and 480B may alternatively have cross-sections of any other regular or irregular shape. Thermal vias 480A and 480B may have any diameter that is substantially constant from end to end. Thermal vias 480A and 480B may alternatively have diameters that vary over a length thereof. Any of thermal vias 480A and 480B may vary one from another in any of the above respects.

A periphery of thermal vias 480A may correspond to a perimeter of interface module cages 364, i.e., define a mounting area for interface module cages 364 on a surface of daughterboard 362. The total effective surface area of thermal vias 480A at the surface of daughterboard 362 may constitute any portion of the total area of the mounting area of interface module cages 364. Some of thermal vias 480A may alternatively not be covered by interface module cages 364. Alternatively, the mounting surfaces of interface module cages 364 may overlap the periphery of thermal vias 480A.

A periphery of thermal vias 480B may correspond to a perimeter of heat sinks 368, i.e., define a mounting area for heat sinks 368 on a surface of daughterboard 362. The total effective surface area of thermal vias 480B at the surface of daughterboard 362 may constitute any portion of the total area of the mounting area of heat sinks 368. Some of thermal vias 480B may alternatively not be covered by heat sinks 368. Alternatively, the mounting surfaces of heat sinks 368 may overlap the periphery of thermal vias 480A.

Thermal vias 480A and 480B may include blind vias that extend from a surface of daughterboard 362 to a predetermined depth of daughterboard 362. Thermal vias 480A and 480B may include backdrilled vias that extend from a predetermined depth of an interior of daughterboard 362 to another predetermined depth of an interior of daughterboard 362. In one implementation, backdrilled vias may interconnect one or more thermal layers 490.

Thermal vias 480A and 480B may include plated through-holes. The plating may be disposed on all or any portion of the circumference of the through-holes. The plating may be any one or more materials having any thermal conductivity. The plating may occupy any portion of the volume of the through-holes. The plating may form a hollow cylinder having an outer diameter and an inner diameter. In one implementation, the inner diameter of the plating may be filled or partially filled with a second material, for example, a soldering material. Any of thermal vias 480A and 480B may vary one from another in any of the above respects.

Thermal planes 490 may include any of one or more materials having any thermal conductivity. In one implementation, thermal planes 490 may include a thermal conductive layer on all or any portion of a surface of daughterboard 362. Thermal planes 490 may have a substantially constant cross-section. Thermal planes 490 may alternatively have a varying cross-section along a length thereof. Any of thermal planes 490 may vary one from another in any of these respects. In one implementation, for example, an inner-most thermal plane 490 may have the largest effective cross-sectional area relative to other thermal planes 490. In another implementation, a thermal plane 490 that is the greatest distance from interface module cages 364 may have the largest effective cross-sectional area relative to other thermal planes 490.

Daughterboard 362 may be formed according to any standard technique for forming a PCB. For example, a layer of copper may be affixed to a layer of an insulating substrate. Patterns may be etched in the copper layer. Additional copper/insulating layers may be laminated to the substrate with etched patterns. In one implementation, a four-ounce copper is used for the copper layers. Other thicknesses of copper may be used. The thickness of the copper may be thicker by any factor than a copper layer thickness (e.g., ½ oz.) used for electrical connections. Through-holes may be drilled, backdrilled, or otherwise formed in the copper/insulator layers. The through-holes may be plated by electrolytic plating or any other suitable technique. In one implementation, a soldering material is then flowed in the plated through-holes.

The dimensions and geometries of thermal vias 480A and 480B and/or thermal planes 490 may be based on factors such as structural integrity, electrical connectivity, and optimal thermal conductivity. For example, thermal vias 480A and 480B and thermal planes 490 may be electrically insulated from electrical connections (not shown) in daughterboard 362. As another example, thermal vias 480A and 480B and/or thermal planes 490 may be formed based on heat generation and/or thermal sensitivity of particular interface modules 366, as described in more detail below.

Exemplary Thermal Management

Figure 6:
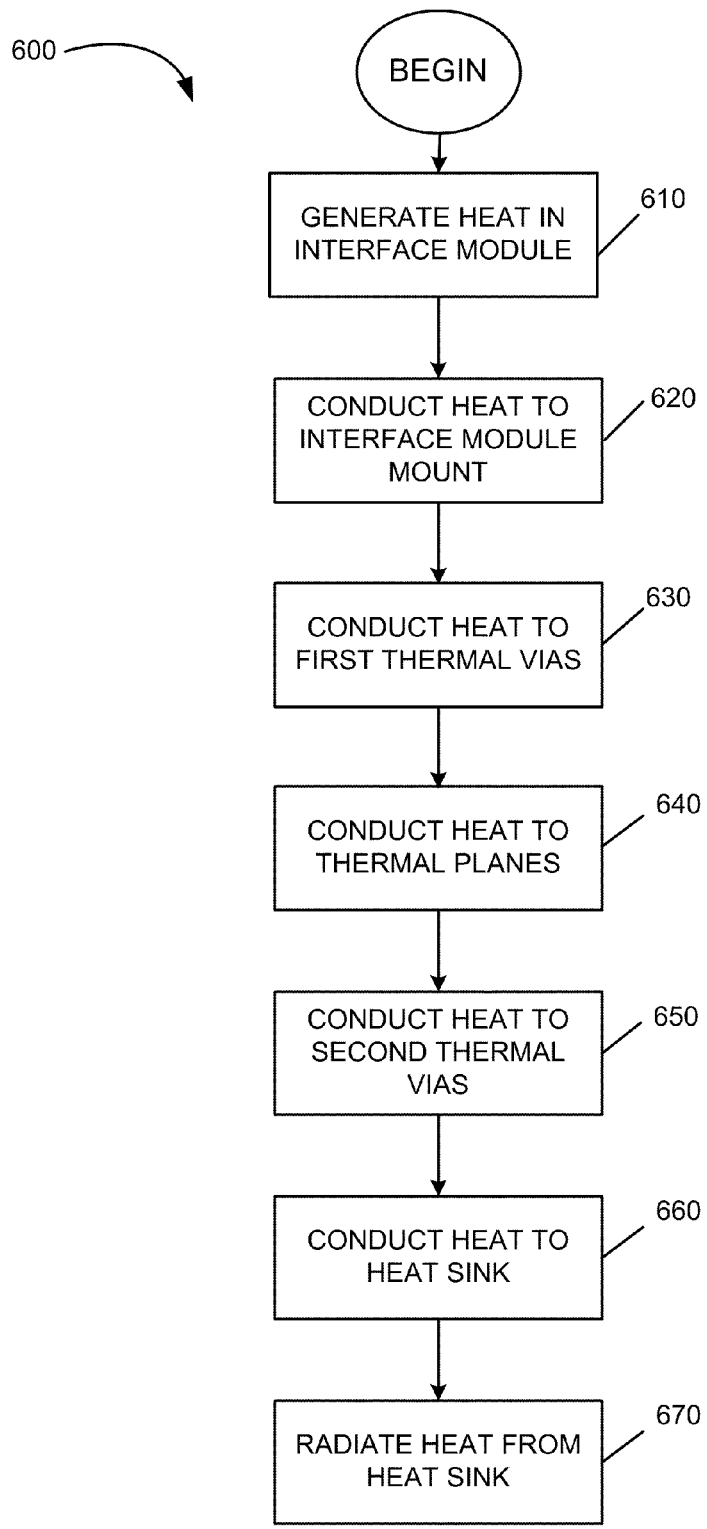
FIG. 6 is a flow diagram of an exemplary thermal management process according to an implementation consistent with the principles of the invention.

FIG. 6 is a flowchart of exemplary thermal management 600 in a device, such as device 100, according to an implementation consistent with principles of the invention. Thermal management 600 may begin with generation of heat from interface module 366, such as an active transceiver, during operations performed by device 100 (act 610). At least a portion of the generated heat may be conducted to an interface module cage 364, in which interface module 366 is plugged (act 620). At least a portion of the heat absorbed by interface module cage 364 may be conducted to thermal vias 480A having a terminal end in an area directly under or near a mounting surface of interface module cage 364 (act 630). In one implementation, one or more thermal vias 480A may directly contact interface module cage 364. At least a portion of the heat conducted to the one or more thermal vias 480A may be conducted to one or more thermal planes 490 (act 640). At least a portion of the heat conducted by the one or more thermal planes 490 may be conducted to thermal vias 480B (act 650). At least a portion of the heat conducted to thermal vias 480B may be conducted to heat sink 368, an attachment portion thereof which may be directly over or near a terminal end of thermal vias 480B (act 660). At least a portion of the heat absorbed by heat sink 368 may be dissipated into available airflow in device 100 (act 670).

It will be appreciated that thermal management 600 may instead be initiated by interface module 366, such as an inactive transceiver, which acts as a secondary heat source, having absorbed heat from a primary source that has generated the heat (e.g., an active transceiver or other component).

In one implementation, the heat path described above may be specific to an associated individual interface module cage 364 in interface unit 360. That is, the effective heat conductivity of an associated heat path may be managed for any given interface module cage 364. The effective heat conductivity of an associated heat path may be based on such factors as the location of the individual interface module cage 364 in interface unit 360, the performance level (i.e., heat generation) of interface module 366 associated with the individual interface module cage 364, the heat sensitivity of interface module 366 associated with the individual interface module cage 364, and thermal gradients experienced over interface unit 360, generally. In this manner, the heat transfer rate (i.e., cooling effect) may be managed from one interface module 366 to another.

Optimizing thermal transfer among interface modules 366, or varying the effective thermal conductivity associated with particular heat paths, may be achieved through the geometries of and interconnection formed by thermal vias 480A and 480B and thermal planes 490. For example, thermal vias 480A may have effective thermal conductivities that differ one from another; thermal planes 490 may have effective thermal conductivities that differ one from another; and/or thermal vias 480B may have effective thermal conductivities that differ one from another. Sets of thermal vias 480A associated with particular areas of daughterboard 362 may differ one from another.

CONCLUSION

Implementations consistent with the principles of the invention make possible efficient heat management in a device employing PCBs having clustered components, including an interface device, a memory, a processor, and other types of devices. For example, heat transfer may be optimized for any given input/output module through interconnected vias and thermal planes in a substrate of an interface unit of an interface card, thereby controlling the temperature of the input/output module.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

For example, implementations consistent with the principles of the invention can be implemented using assemblies and parts other than those illustrated in the figures and described in the specification without departing from the spirit of the invention. Parts may be added and/or removed from device 100, interface unit 360, and/or daughterboard 362 depending on specific deployments and/or applications. Further, disclosed implementations may not be limited to any specific combination of components.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

The scope of the invention is defined by the claims and their equivalents.

What is claimed is:

1. A method comprising:
   conducting heat generated at a first surface of a substrate to a first plurality of thermal vias that extend into the first surface of the substrate;
   conducting the heat from the first plurality of thermal vias, that are coupled to an interface module coupled to the first surface of the substrate, to a thermal plane positioned along a length of the substrate, the thermal plane being exposed at one surface edge of the substrate and not being exposed at an opposing surface edge of the substrate;
   dissipating the heat, via a second plurality of thermal vias and a component mounted to the exposed one surface edge of the substrate, into a provided airflow, the component being mounted parallel to the exposed one surface edge of the substrate and parallel to the provided airflow.

2. The method of claim 1, further comprising:
   conducting at least a portion of heat absorbed by an inactive component, mounted on the first surface of the substrate, to the first plurality of thermal vias.

3. The method of claim 1, where conducting the heat from the first plurality of thermal vias to the thermal plane includes:
   conducting the heat from the first plurality of vias to a plurality of thermal planes, including the thermal plane, where each of the plurality of thermal planes is associated with a respective, different thermal conductivity.

4. The method of claim 1, further comprising:
   determining a heat transfer rate of the substrate based on particular thermal factors affecting heat conduction; and
   plating, based on the determined heat transfer rate, at least a portion of a circumference of the first plurality of thermal vias or at least a portion of a circumference of the second plurality of thermal vias with a thermal conductor.

5. The method of claim 1, further comprising:
   embedding the thermal plane in the substrate, and
   thermally coupling, based on embedding the thermal plane, the first plurality of thermal vias and the second plurality of thermal vias.

6. The method of claim 5, where thermally coupling the first plurality of thermal vias and the second plurality of thermal vias includes:
   forming a first plurality of through holes in a first area of the first surface of the substrate; and
   forming a second plurality of through holes in a second area of the first surface of the substrate.

7. The method of claim 6, where thermally coupling the first plurality of thermal vias and the second set of thermal vias further includes:
   determining a heat transfer rate of the substrate based on particular thermal factors affecting heat conduction; and
   plating, based on the determined heat transfer rate, at least a portion of a circumference of the first plurality of through holes or at least a portion of a circumference of the second plurality of through holes with a thermal conductor.

8. The method of claim 5, where embedding the thermal plane in the substrate includes:
   embedding a plurality of thermal planes in the substrate, where each of the thermal planes is associated with a different thermal conductivity.

9. The method of claim 1, further comprising:
   forming the first plurality of thermal vias in the first surface of the substrate to define a first area, of the substrate, to receive an interface module cage of an interface card;
   forming the second plurality of thermal vias in the first surface of the substrate to define a second area of the substrate, to receive the component; and
   embedding, in the substrate, the thermal plane to thermally couple the interface module received by the interface module cage to the component.

10. The method of claim 9, where forming the first plurality of thermal vias includes:
    forming a uniform pattern of the first plurality of thermal vias in the first surface of the substrate to define the first area of the substrate.

11. The method of claim 10, where forming the second plurality of thermal vias includes:
    forming a uniform pattern of the second plurality of thermal vias in the first surface of the substrate to define the second area of the substrate.

12. The method of claim 10, where forming the second plurality of thermal vias includes:
    forming a non-uniform pattern of the second plurality of thermal vias in the first surface of the substrate to define the second area of the substrate.

13. The method of claim 9, where forming the first plurality of thermal vias includes:
    forming a non-uniform pattern of the first plurality of thermal vias in the first surface of the substrate to define the first area of the substrate.

14. The method of claim 13, where forming the second plurality of thermal vias includes:
    forming a uniform pattern of the second plurality of thermal vias in the first surface of the substrate to define the second area of the substrate.

15. The method of claim 13, where forming the second plurality of thermal vias includes:
    forming a non-uniform pattern of the second plurality of thermal vias in the first surface of the substrate to define the second area of the substrate.

* * * * *

UNITED STATES PATENT AND TRADEMARK OFFICE
CERTIFICATE OF CORRECTION

| | |
|---|---|
| PATENT NO. | : 8,318,546 B2 |
| APPLICATION NO. | : 13/090375 |
| DATED | : November 27, 2012 |
| INVENTOR(S) | : David J. Lima |

Page 1 of 1

It is certified that error appears in the above-identified patent and that said Letters Patent is hereby corrected as shown below:

Claim 5, column 8, line 2 should read: "embedding the thermal plane in the substrate; and"
Claim 7, column 8, line 13 should read: "first plurality of thermal vias and the second plurality of thermal"
Claim 9, column 8, line 31 should read: "surface of the substrate to define a second area, of the"
Claim 9, column 8, lines 34-35 should read: "couple the interface module, that is received by the interface module cage, to the component."

Signed and Sealed this
Twelfth Day of February, 2013

Teresa Stanek Rea
*Acting Director of the United States Patent and Trademark Office*